United States Patent
Choi et al.

(10) Patent No.: US 8,680,560 B2
(45) Date of Patent: Mar. 25, 2014

(54) LED AND LED PACKAGE

(75) Inventors: Jeong Hyeon Choi, Seoul (KR); Jeung Mo Kang, Seoul (KR); Du Hyun Kim, Seoul (KR); Jae Wook Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 22 days.

(21) Appl. No.: 12/990,170

(22) PCT Filed: Jun. 5, 2009

(86) PCT No.: PCT/KR2009/003039
§ 371 (c)(1),
(2), (4) Date: Feb. 9, 2011

(87) PCT Pub. No.: WO2010/095785
PCT Pub. Date: Aug. 26, 2010

(65) Prior Publication Data
US 2011/0133221 A1    Jun. 9, 2011

(30) Foreign Application Priority Data
Feb. 19, 2009  (KR) .................. 10-2009-0013754

(51) Int. Cl.
*H01L 33/38* (2010.01)
(52) U.S. Cl.
USPC .................................... 257/99; 257/E33.065
(58) Field of Classification Search
CPC ...... H01L 33/385; H01L 33/387; H01L 33/08
USPC ....................... 257/98, 99, E33.065
See application file for complete search history.

(56) References Cited

U.S. PATENT DOCUMENTS

| 6,255,129 B1 * | 7/2001 | Lin ................................ 438/26 |
| 2006/0208273 A1 * | 9/2006 | Kang ............................. 257/103 |
| 2007/0131958 A1 * | 6/2007 | Hsu et al. ....................... 257/99 |
| 2011/0278626 A1 | 11/2011 | Kim et al. |

FOREIGN PATENT DOCUMENTS

| CN | 1820376 A | 8/2006 |
| CN | 101207050 | 6/2008 |
| JP | 05-021846 | 1/1993 |
| JP | 7-30153 | 1/1995 |
| JP | 8102552 | 4/1996 |
| JP | 8330631 | 12/1996 |
| JP | 9129922 | 5/1997 |
| JP | 3333356 | 10/2002 |
| JP | 2003-110139 | 4/2003 |
| KR | 2002-0026703 | 4/2002 |
| KR | 2004005270 | 1/2004 |

OTHER PUBLICATIONS

Machine English translation of JP08-330631.*
International Search Report for PCT/KR2009/003039 dated Mar. 15, 2010.

* cited by examiner

*Primary Examiner* — Yu Chen
(74) *Attorney, Agent, or Firm* — KED & Associates, LLP

(57) ABSTRACT

A light emitting device (LED) and Package of the same are provided. The LED comprises a first conductivity type semiconductor layer, an active layer, a second conductivity type semiconductor layer, a first dielectric layer, and a first electrode layer. The first conductivity type semiconductor layer, the active layer, and the second conductivity type semiconductor layer are on a substrate. The first dielectric layer covers the edges of the second conductivity type semiconductor layer and the active layer. The first electrode layer covers the edge of the first conductivity type semiconductor layer.

20 Claims, 14 Drawing Sheets

LED AND LED PACKAGE

CROSS-REFERENCE TO RELATED APPLICATIONS

The present application claims priority under 35 U.S.C. 119 and 35 U.S.C. 365 to Korean Patent Application No. 10-2009-0013754 (filed on Feb. 19, 2009), which is hereby incorporated by reference in its entirety.

BACKGROUND

The present disclosures relate to light emitting devices (LEDs) and Package of the same.

Light emitting devices (LEDs) are semiconductor devices that convert a current into light. After red LEDs was commercialized, red LEDs and green LEDs have been used as light sources for electronic devices including information communication devices.

For example, a nitride semiconductor such as a gallium nitride (GaN) semiconductor has a high thermal stability and a wide band gap. The GaN semiconductor can be combined with other elements (e.g., In and Al) to fabricate a semiconductor layer emitting green, blue or white light, and its emitted wavelength is easy to control. Thus, the GaN semiconductor has attracted much attention in the technical fields of high-power electronic devices including LEDs.

Recently, a high-definition display application is being developed to replace a lamp type of a backlight unit (BLU) of a liquid crystal display (LCD) by a high-power LED array.

General requirements such as high brightness, low power consumption, and efficient heat dissipation must be satisfied in order to use such a high-power LED. Therefore, many manufacturers are accelerating prior occupation of the market by accumulating the technical foundations.

With the expansion of the high-power LED market, technologies in various stages such as chip, package and module are being developed for effective design techniques for heat dissipation.

SUMMARY

Embodiments provide light emitting devices (LEDs) and Package of the same capable of increasing the effect of uniform current spreading of external carriers into a device.

Embodiments also provide LEDs and Package of the same capable of implementing one wire-bonding packaging.

Embodiments also provide LEDs and Package of the same capable of dissipating heat through a wide area.

Embodiments also provide LEDs and Package of the same capable of improving thermal characteristics and current spreading by an isolation structure for a large-area chip.

In one embodiment, an LED comprises: a first conductivity type semiconductor layer, an active layer, and a second conductivity type semiconductor layer on a substrate; a first dielectric layer covering the edges of the second conductivity type semiconductor layer and the active layer; and a first electrode layer covering the edge of the first conductivity type semiconductor layer.

In another embodiment, an LED comprises: a light emitting structure comprising a first conductivity type semiconductor layer, an active layer, and a second conductivity type semiconductor layer on a substrate; a first electrode on the first conductivity type semiconductor layer exposed by removing the portions of the active layer and the second conductivity type semiconductor layer; a third dielectric layer covering the edge of the active layer and the first conductivity type semiconductor layer; and a second electrode layer on the second conductivity type semiconductor layer.

In one embodiment, an LED Package comprises: a first conductivity type semiconductor layer, an active layer, and a second conductivity type semiconductor layer on a substrate; a first dielectric layer covering the edges of the second conductivity type semiconductor layer and the active layer; and a first electrode layer covering the edge of the first conductivity type semiconductor layer.

In another embodiment, an LED Package comprises: a light emitting structure comprising a first conductivity type semiconductor layer, an active layer, and a second conductivity type semiconductor layer on a substrate; a first electrode on the first conductivity type semiconductor layer exposed by removing the portions of the active layer and the second conductivity type semiconductor layer; a third dielectric layer covering the edge of the active layer and the first conductivity type semiconductor layer; and a second electrode layer on the second conductivity type semiconductor layer.

The details of one or more embodiments are set forth in the accompanying drawings and the description below. Other features will be apparent from the description and drawings, and from the claims.

DETAILED DESCRIPTION OF THE EMBODIMENTS

Light emitting devices (LEDs) and Package of the same according to embodiments will be described in detail with reference to the accompanying drawings.

In the description of embodiments, it will be understood that when a layer (or film) is referred to as being "on/over" another layer or substrate, it can be directly on/over another layer or substrate, or intervening layers may also be present. Further, it will be understood that when a layer is referred to as being "under/below" another layer, it can be directly under/below another layer, and one or more intervening layers may also be present. In addition, it will also be understood that when a layer is referred to as being "between" two layers, it can be the only layer between the two layers, or one or more intervening layers may also be present.

Embodiment 1

Figure 1:
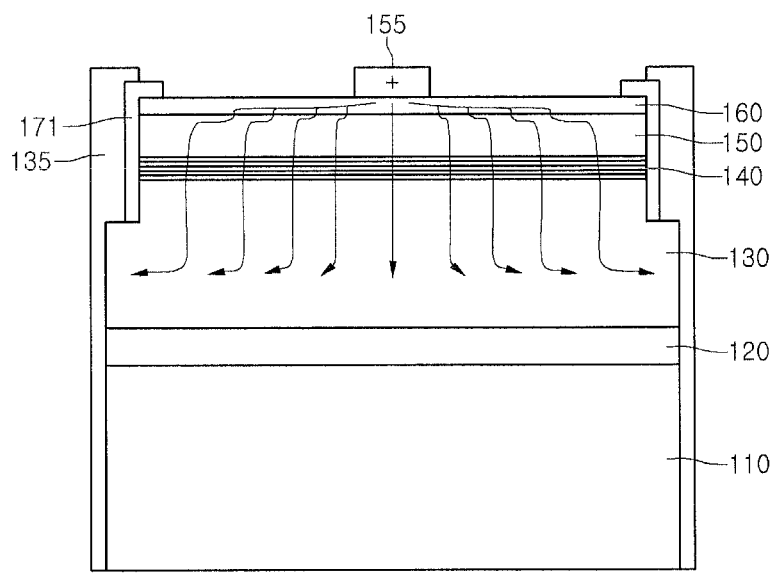
FIGS. 1 and 2 are respectively a sectional view and a plan view of a light emitting device (LED) according to an embodiment 1.
Figure 2:
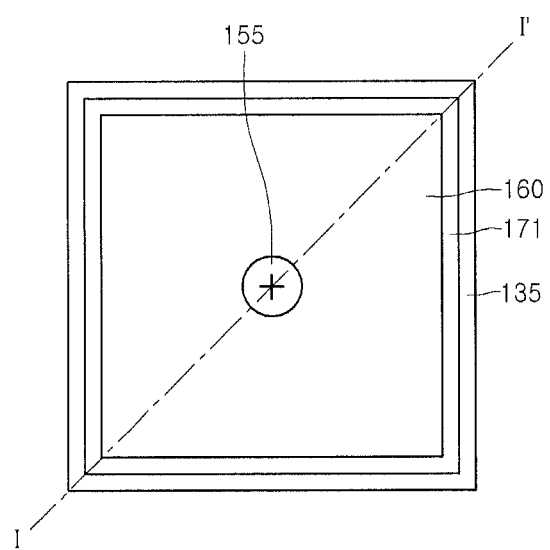
Figure 3:
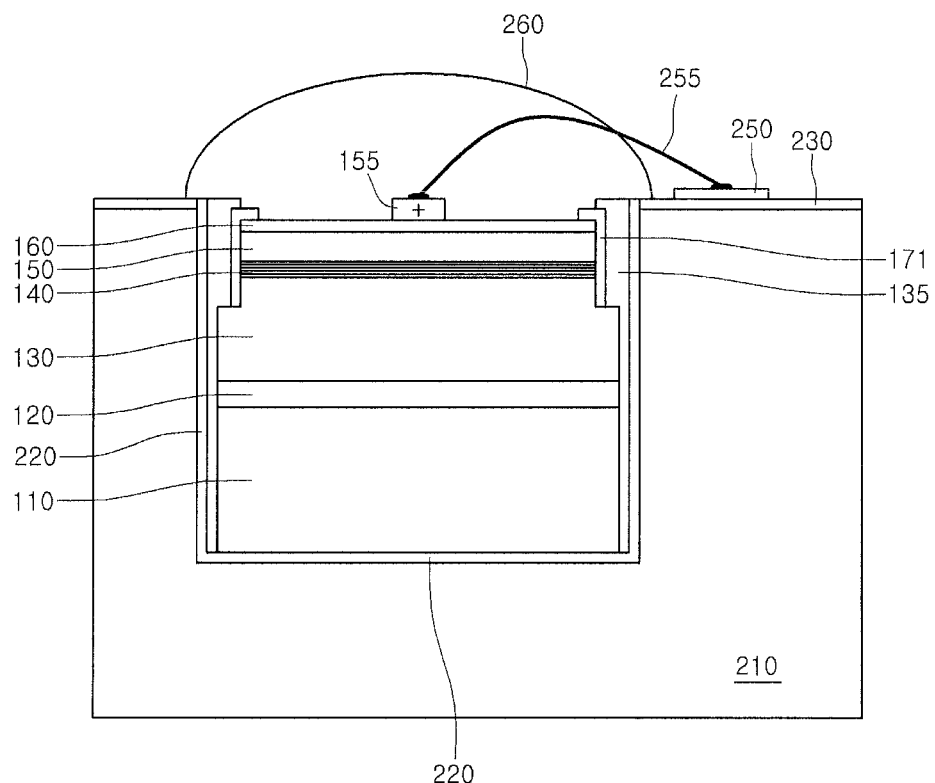
FIG. 3 is a sectional view of an LED package according to an embodiment 1.

FIGS. 1 and 2 are respectively a sectional view and a plan view of a light emitting device (LED) according to an embodiment 1. FIG. 1 is a vertical sectional view taken along a line I-I' of FIG. 2.

Referring to FIGS. 1 and 2, an LED according to an embodiment 1 may include: a first conductivity type semiconductor layer 130, an active layer 140, and a second conductivity type semiconductor layer 150 formed on a substrate 110; a first dielectric layer 171 covering the edges of the second conductivity type semiconductor layer 150 and the active layer 140; and a first electrode layer 135 covering the edge of the first conductivity type semiconductor layer 130.

Although it is illustrated that the first electrode layer 135 is formed also on the first dielectric layer 171, the embodiment is not limited thereto. That is, the first electrode layer 135 may not be formed on the first dielectric layer 171.

Also, although it is illustrated that the first electrode layer 135 is formed not only on the first conductivity type semiconductor layer 130 but also on the substrate 110 and a buffer layer 120, the embodiment is not limited thereto. That is, the first electrode layer 135 may be formed only on the first conductivity type semiconductor layer 130.

If the first electrode layer 135 is formed not only on the first conductivity type semiconductor layer 130 but also on the substrate 110 and the buffer layer 120, the effective contact area is increased to improve current spreading and thermal characteristics.

FIGS. 1 and 2 illustrate a method of forming an n-type electrode. The edges of the active layer 140, and the second conductivity type semiconductor layer 150 are partially etched and it is passivated by the first dielectric layer 171. Thereafter, an N-type electrode is formed by the first electrode layer 135 on the first conductivity type semiconductor layer 130, thereby uniformalizing current injection into an epitaxial layer.

For example, if a non-etched LED chip is a 500 μm×500 μm square chip in the plan view, the region from each side to about 25 to 50 μm point of the square may be regarded as the edge to be removed, to which the present invention is not limited.

The embodiment forms one of two electrodes on the edge of the exposed epitaxial layer in a lateral type structure, thereby making it possible to increase the current spreading effects through the outer electrode of the LED chip. Also, the embodiment can increase the current spreading effects through a chip isolation structure, thereby making it possible to dissipate heat through a wide area.

The LED according to the embodiment 1 has a structure where the first electrode layer 135 is formed on the edge to implement an N-type electrode, as shown in FIGS. 1 and 2.

The embodiment 1 exposes the first conductivity type semiconductor layer 130 of the edge through an etching process; isolates it by the first dielectric layer 171 (e.g., a passivation layer); deposits the first electrode layer 135 thereon; and performs overall or partial soldering for a package with good thermal conductivity. For example, the package may be a metal-based package, to which the embodiment is not limited.

Current flows are schematically shown in FIG. 1. Currents flow from an upper p-type electrode 155 to the n-type electrode of the first electrode layer 135 formed on the edge, thus making it possible to achieve uniform current spreading effects.

The embodiment 1 overcomes the problem of localized light emission, thus reducing unnecessary power consumption caused by the corresponding voltage and current.

The embodiment 1 forms the n-type electrode on the edge to fabricate an LED chip, thus enabling bottom/side contacts with a package with good thermal conductivity through soldering. To this end, the first electrode layer 135 (i.e., the n-type electrode on the edge) may include a high-reflective metal layer for extracting generated light to the outside, to which the embodiment it not limited.

FIG. is a sectional view of an LED package according to an embodiment 1, which shows the final sectional structure of the package for the LED chip structure of FIG. 1.

Except a light extraction unit such as a transparent resin 260 on the top of the chip, the first electrode layer 135 and a package metal body 210 contact with each other through a solder 220 to form the n-type electrode.

A current according to chip driving can flow through the contact interface. Therefore, in comparison with the current injection by the two wire-bonding of the related art, the embodiment can reduce an operation voltage and can dissipate unnecessary heat caused by intra-chip heat emission.

That is, according to the embodiment, a current through the electrode on the chip edge can spread very well, thus enabling operation voltage reduction and attachment without wire bonding. Therefore, it is possible to provide one wire-bonding packaging.

Also, because the thermal improvement is important for the package lifetime in a high-power application display, the reliability can be increased. In particular, because the thermal conductivity of the bottom substrate used in the lateral type structure is relatively very low, the dissipation of generated heat to the outside is important.

In the case of the large-area structure, the embodiment can increase the current spreading effects through the chip isolation structure, thus making it possible to dissipate heat through a large area.

Also, the embodiment improves heat dissipation by contacting the package and the chip bottom portion through soldering, thereby making it possible to improve the current spreading and thermal characteristics by a small-area isolation structure of a large-area chip.

The embodiment electrically isolates an upper p-type pad 250 from the package surface by a dielectric 230 and performs wire-bonding 255, so that a metal package forms one electrode and the upper p-type pad 250 forms another electrode.

FIGS. 4 to 7 are sectional views showing a process for fabricating an LED according to an embodiment 1.

Figure 4:
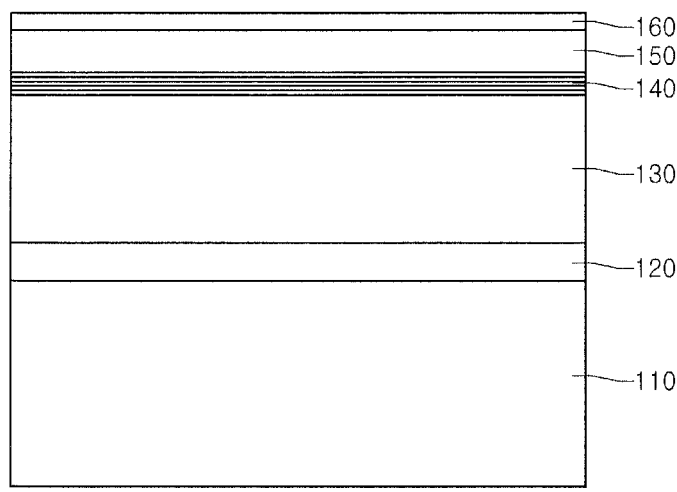
FIGS. 4 to 7 are sectional views showing a process for fabricating an LED according to an embodiment 1.

Referring to FIG. 4, a substrate 110 is prepared. The substrate 110 may be a sapphire ($Al_2O_3$) monocrystalline substrate, to which the embodiment is not limited. A wet cleaning process may be performed to remove the impurities of the surface of the substrate 110. A buffer layer 120 may be formed on the substrate 110.

A first conductivity type semiconductor layer 130 is formed on the buffer layer 120. For example, a chemical vapor deposition (CVD) process, a molecular beam epitaxy (MBE) process, a sputtering process, or a hydride vapor phase epitaxy (HYPE) process may be used to form the first conductivity type semiconductor layer 130. Also, the first conductivity type semiconductor layer 130 may be formed by injecting tri-methyl gallium gas (TMGa), ammonia gas (NH$_3$), nitrogen gas (N$_2$), or silane gas (SiH$_4$) containing n-type impurity such as silicon (Si) into a process chamber.

An active layer 140 is formed on the first conductivity type semiconductor layer 130. The active layer 140 emits a light of energy determined by the specific energy band of the active layer material when electrons injected through the first conductivity type semiconductor layer 130 recombine with holes injected through a second conductivity type semiconductor layer 150.

The active layer 140 may have a single or multi quantum well structure that is formed by alternately laminating nitride semiconductor layers with different energy bands once or several times. For example, the active layer 140 may have a multiple quantum well structure with an InGaN/GaN structure that is formed by injecting tri-methyl gallium gas (TMGa), ammonia gas (NH$_3$), nitrogen gas (N$_2$), or tri-methyl indium gas (TMIn), to which the embodiment is not limited.

A second conductivity type semiconductor layer 150 is formed on the active layer 140. For example, the second conductivity type semiconductor layer 150 may be formed by injecting tri-methyl gallium gas (TMGa), ammonia gas (NH$_3$), nitrogen gas (N$_2$), hydrogen gas (H$_2$), or bisethylcyclopentadienyl magnesium (EtCp$_2$Mg){Mg(C$_2$H$_5$C$_5$H$_4$)$_2$} containing p-type impurity such as magnesium (Mg) into a process chamber, to which the embodiment is not limited.

An ohmic contact layer 160 is formed on the second conductivity type semiconductor layer 150. For example, the ohmic contact layer 160 may be formed of at least one of ITO (Indium-Tin-Oxide), IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO, to which the embodiment is not limited. The embodiment forms the ohmic contact layer, thereby making it possible to increase the electric conductivity and the light extraction efficiency.

Also, according to the embodiment 1, the current spreading through the ohmic contact layer 160 plays an important role for uniform distribution of light emission in the upper portion of the chip.

Figure 5:
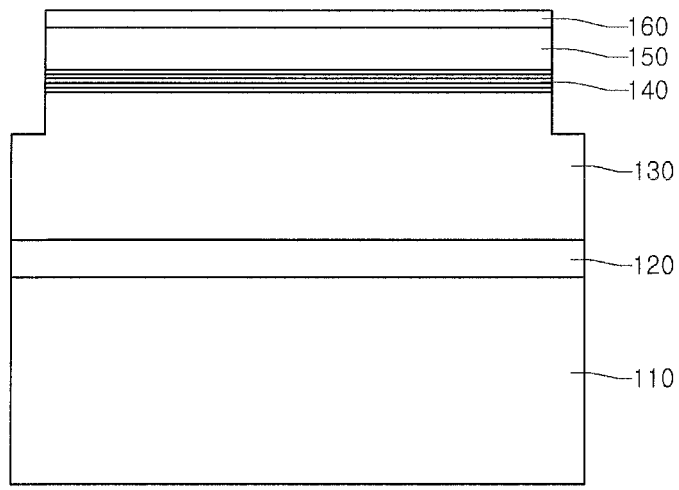

Referring to FIG. 5, the edges of the ohmic contact layer 160, the second conductivity type semiconductor layer 150, and the active layer 140 are removed to expose the first conductivity type semiconductor layer 130. For example, a first pattern (not shown) is formed, and the first pattern is used as an etch mask to remove the edges of the ohmic contact layer 160, the second conductivity type semiconductor layer 150, and the active layer 140, thereby exposing the first conductivity type semiconductor layer 130. The first pattern may be formed of silicon nitride, silicon oxide, or photoresist. Thereafter, the first pattern may be removed through a wet etching process or an ashing process.

For example, if the non-etched LED chip is a 500 μm×500 μm square chip in the plan view, the region from each side to about 25 to 50 μm point of the square may be regarded as the edge to be removed, to which the present invention is not limited.

Figure 6:
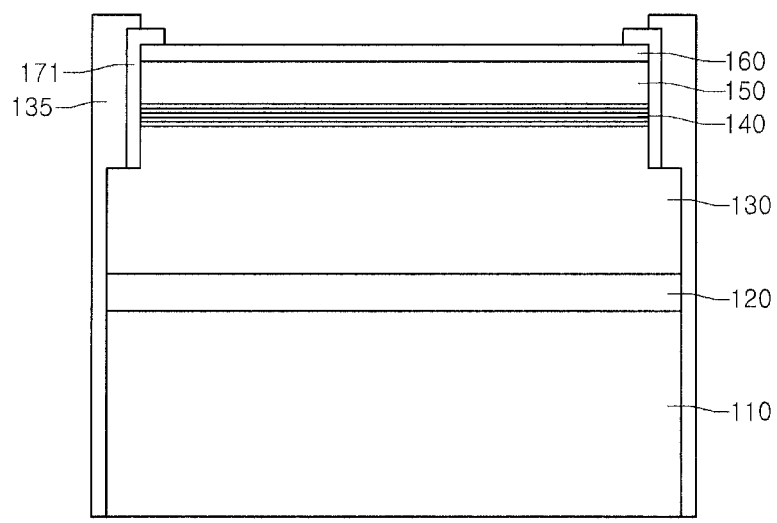

Referring to FIG. 6, a first dielectric layer 171 is formed to cover the edges of the ohmic contact layer 160, the second conductivity type semiconductor layer 150 and the active layer 140. For example, an oxide layer or a nitride layer may be used to form the first dielectric layer 171 (i.e., the passivation layer) on the surface of the epitaxial layer exposed to suppress a leakage current caused by surface instability. The first dielectric layer 171 serves to electrically isolate the active layer 140, the second conductivity type semiconductor layer 150, and a first electrode layer 135 to be formed later.

A first electrode layer 135 is formed to cover the edges of the second conductivity type semiconductor layer 150, the active layer 140, the substrate 110, and the first conductivity type semiconductor layer 130.

Although FIG. 6 illustrates that the first electrode layer 135 is formed also on the first dielectric layer 171, the embodiment is not limited thereto. That is, the first electrode layer 135 may not be formed on the first dielectric layer 171.

Also, it is illustrated that the first electrode layer 135 is formed not only on the first conductivity type semiconductor layer 130 but also on the substrate 110 and the buffer layer 120, the embodiment is not limited thereto. That is, the first electrode layer 135 may be formed only on the first conductivity type semiconductor layer 130.

If the first electrode layer 135 is formed not only on the first conductivity type semiconductor layer 130 but also on the substrate 110 and the buffer layer 120, the effective contact area is increased to improve current spreading and thermal characteristics.

In the embodiment, the first electrode layer 135 may be formed of a metal capable of reflecting light. For example, the first electrode layer 135 may be formed of a metal layer containing aluminum (Al), argentum (Ag), or an Al or Ag-containing metal alloy that well reflects the light emitted from the active layer.

According to the embodiment, one of the two electrodes is formed on the edge of the exposed epitaxial layer in the lateral type structure, thereby making it possible to increase the spreading effects through the LED chip edge electrode.

Figure 7:
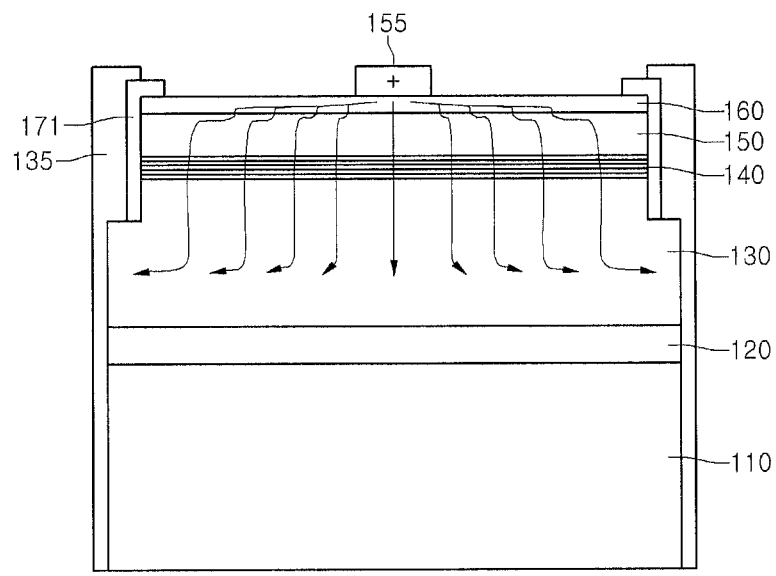

Referring to FIG. 7, a second electrode 155 is formed on the ohmic contact layer 160.

According to the embodiment, one of the two electrodes is formed on the edge of the epitaxial layer in the lateral type structure, thereby making it possible to increase the current spreading effects through the LED chip edge electrode.

Also, the embodiment can increase the current spreading effects through the chip isolation structure, thus making it possible to dissipate heat through a wide area.

Embodiment 2

Figure 8:
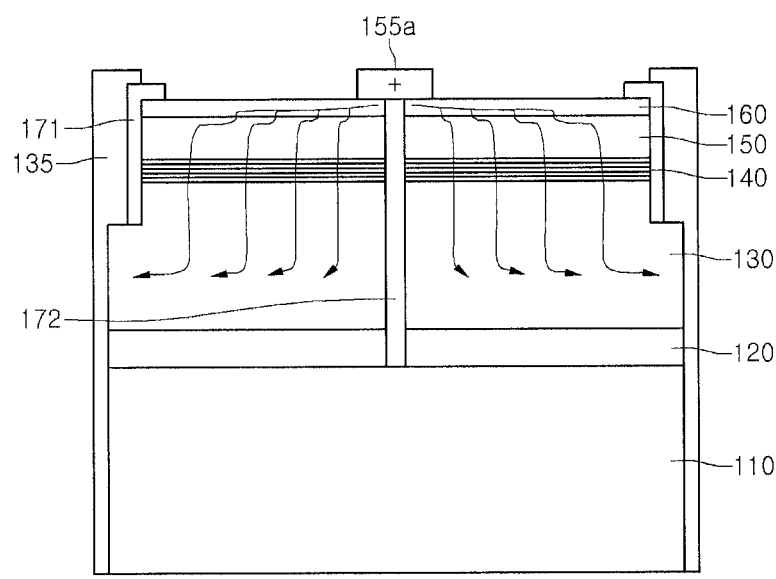
FIGS. 8 and 9 are respectively a sectional view and a plan view of an LED according to an embodiment 2.
Figure 9:
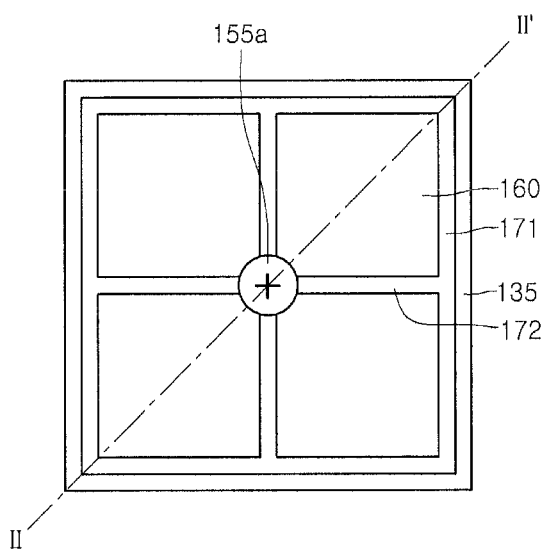
Figure 10:
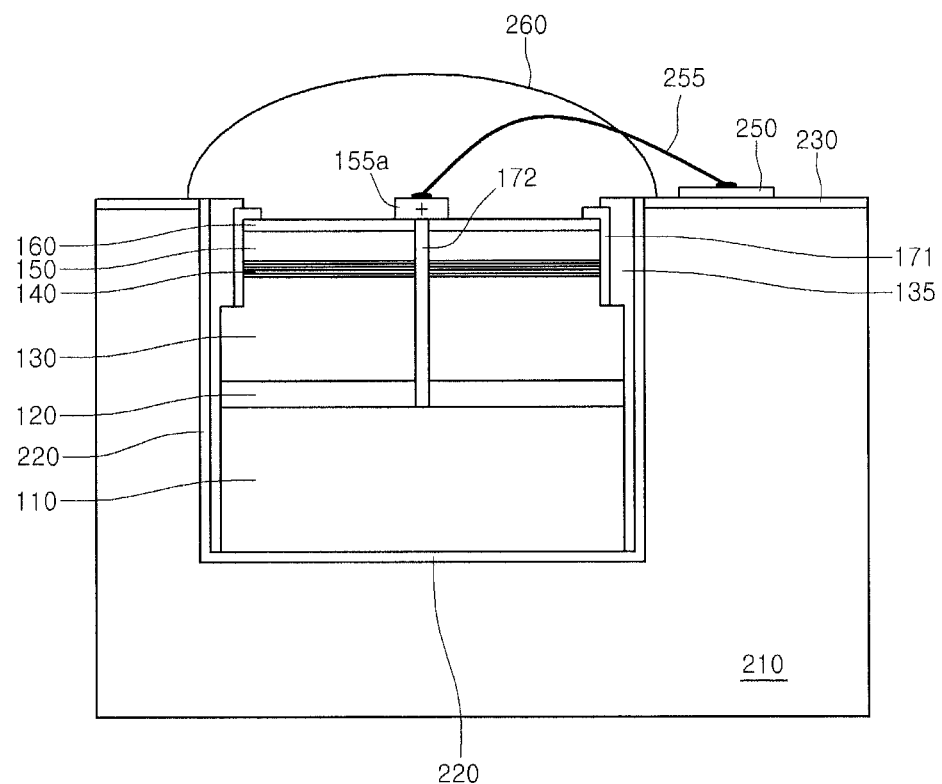
FIG. 10 is a sectional view of an LED package according to an embodiment 2.

FIGS. 8 and 9 are respectively a sectional view and a plan view of an LED according to an embodiment 2. FIG. 10 is a sectional view of an LED package according to an embodiment 2. FIG. 8 is a sectional view taken along a line II-II' of FIG. 9.

The embodiment 2 may use the technical features of the embodiment 1. Hereinafter, a description of an overlap with the embodiment 1 will be omitted for conciseness.

Referring to FIGS. 8 and 9, the embodiment 2 includes a second dielectric layer 172 that divides the second conductivity type semiconductor layer 150, the active layer 140, and the first conductivity type semiconductor layer 130 into a plurality of regions.

As shown in FIGS. 8 and 9, the embodiment 2 divides the epitaxial layer into quartered squares through an etching process and distributes a current flow of a large-area chip to the quartered regions, thereby making it possible to improve the uniformity and suppress the localized heat generation. The epitaxial layer may also be divided into two or three equal parts.

Figure 11:
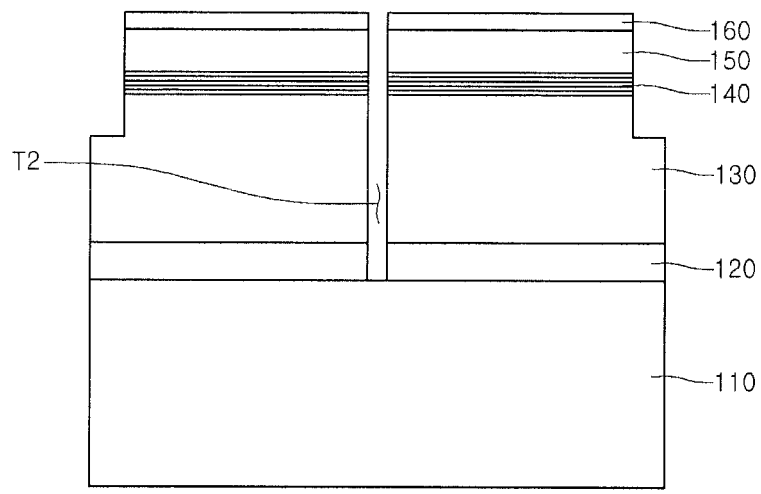
FIGS. 11 to 13 are sectional views showing a process for fabricating an LED according to an embodiment 2.
Figure 12:
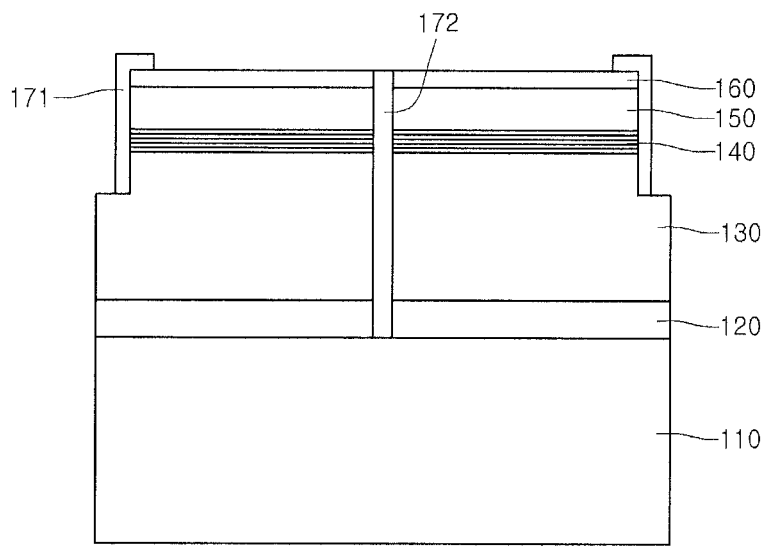
Figure 13:
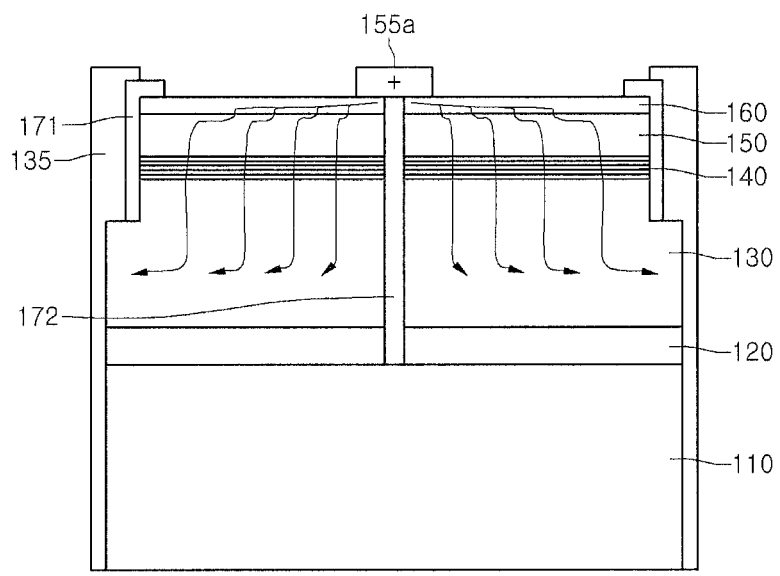

FIGS. 11 to 13 are sectional views showing a process for fabricating an LED according to an embodiment 2.

Referring to FIG. 11, a first conductivity type semiconductor layer 130, an active layer 140, and a second conductivity type semiconductor layer 150 are formed on a substrate 110. Herein, a buffer layer 120 may be further formed on the substrate 110 and an ohmic contact layer 160 may be further formed on the second conductivity type semiconductor layer 150.

The edges of the ohmic contact layer 160, the second conductivity type semiconductor layer 150, and the active layer 140 are removed to expose the first conductivity type semiconductor layer 130.

Also, the embodiment 2 forms a second trench T2 that divides the ohmic contact layer 160, the second conductivity type semiconductor layer 150, the active layer 140, and the first conductivity type semiconductor layer 130 into a plurality of regions.

Referring to FIG. 12, a first dielectric layer 171 is formed to cover the edges of the ohmic contact layer 160, the second conductivity type semiconductor layer 150 and the active layer 140, and the exposed first conductivity type semiconductor layer 130. Also, a second dielectric layer 172 is formed to fill the second trench T2. Herein, after formation of a dielectric layer (not shown) covering the edges of the ohmic contact layer 160, the second conductivity type semiconductor layer 150 and the active layer 140, and the exposed first conductivity type semiconductor layer 130, the dielectric layer on the ohmic contact layer 160 is removed, thereby forming the first dielectric layer 171 and the second dielectric layer 172 simultaneously.

The embodiment 2 divides the epitaxial layer into quartered squares through an etching process and distributes a current flow of a large-area chip to the quartered regions, thereby making it possible to improve the uniformity and suppress the localized heat generation. The epitaxial layer may also be divided into two or three equal parts.

A first electrode layer 135 may be formed to cover the edges of the ohmic contact layer 160 with the first dielectric layer 171, the second conductivity type semiconductor layer 150, the active layer 140, the substrate 110, and the first conductivity type semiconductor layer 130.

The first electrode layer 135 may be formed only on the first conductivity type semiconductor layer 130.

A common second electrode 155*a* may be formed on the divided second conductivity type semiconductor layer 150 or the ohmic contact layer 160. For example, the common second electrode 155*a* may be formed to contact all of the divided second conductivity type semiconductor layers 150 or the divided ohmic contact layers 160.

Herein, the first electrode layer 135 and the common second electrode 155*a* may be simultaneously formed of the same material. For example, a metal layer is formed to cover the LED chip, and the metal layer is removed to leave the metal layer on the common second electrode 155*a* and expose the first dielectric layer 171, thereby forming the first electrode layer 135 and the common second electrode 155*a* simultaneously.

Embodiment 3

Figure 14:
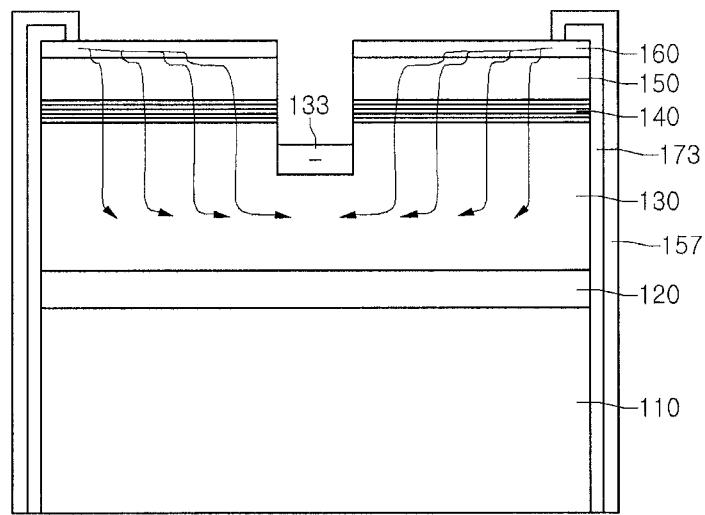
FIGS. 14 and 15 are respectively a sectional view and a plan view of an LED according to an embodiment 3.
Figure 15:
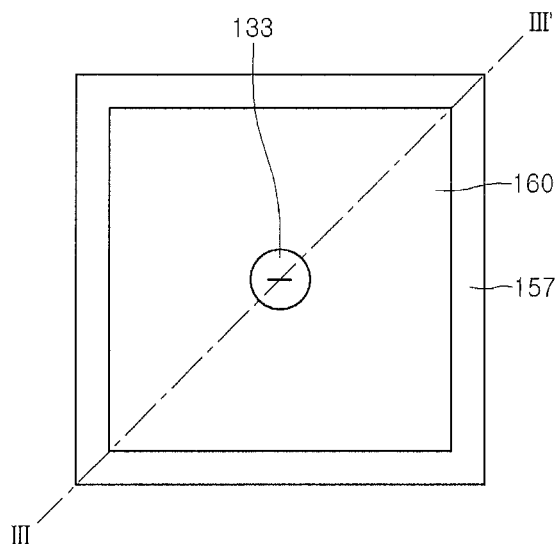
Figure 16:
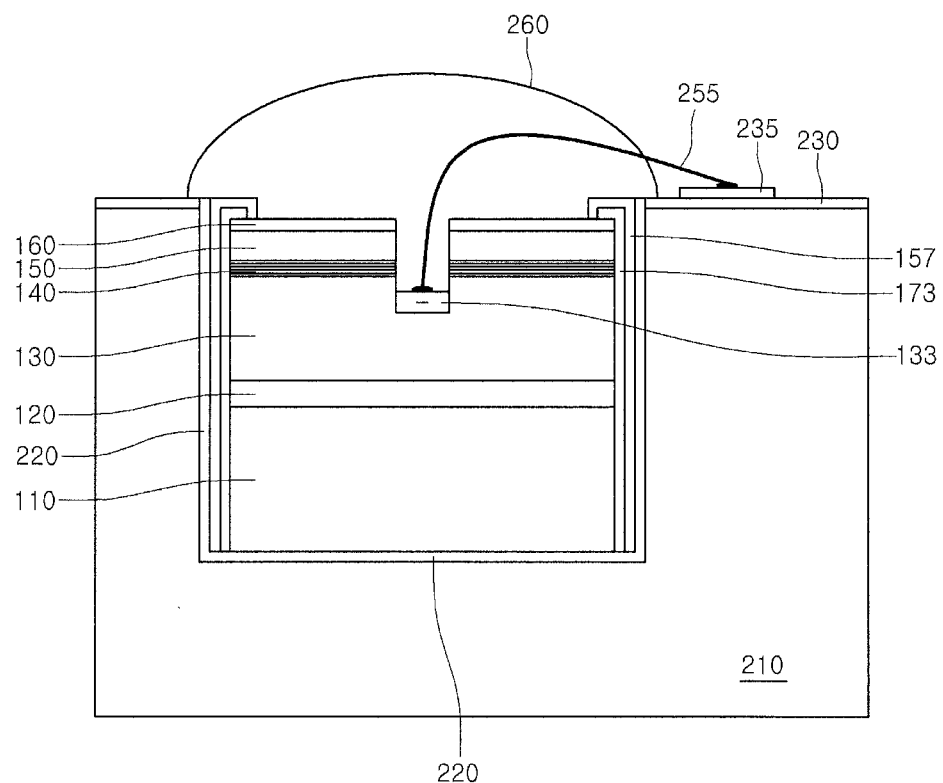
FIG. 16 is a sectional view of an LED package according to an embodiment 3.

FIGS. 14 and 15 are respectively a sectional view and a plan view of an LED according to an embodiment 3. FIG. 16 is a sectional view of an LED package according to an embodiment 3. FIG. 14 is a vertical sectional view taken along a line of FIG. 15.

The embodiment 3 may use the technical features of the embodiment 1. Hereinafter, a description of an overlap with the embodiment 1 will be omitted for conciseness.

The LED according to the embodiment 3 may include: a first conductivity type semiconductor layer 130, an active layer 140, a second conductivity type semiconductor layer 150 formed sequentially on a substrate 110; a first electrode 133 formed on the center of the first conductivity type semiconductor layer 130 exposed by removing the portions of the active region 140 and the second conductivity type semiconductor layer 150; a third dielectric layer 173 covering the edges of the substrate 110, the first conductivity type semiconductor layer 130, the active layer 140 and the second conductivity type semiconductor layer 150; and a second electrode layer 157 around the upper portion of the second conductivity type semiconductor layer 150.

The embodiment 3 implements the second electrode layer 157 to be uses as a p-type electrode at the edge. The embodiment 3 etches the centers of the ohmic contact layer 160, the second conductivity type semiconductor layer 150 and the active layer 140, and forms an n-type electrode 133 in the center region of the first conductivity type semiconductor layer 130. In FIG. 16, the n-type electrode 133 is wire-bonded to an N-type pad 235.

FIGS. 17 to 20 are sectional views showing a process for fabricating an LED according to an embodiment 3.

Figure 17:
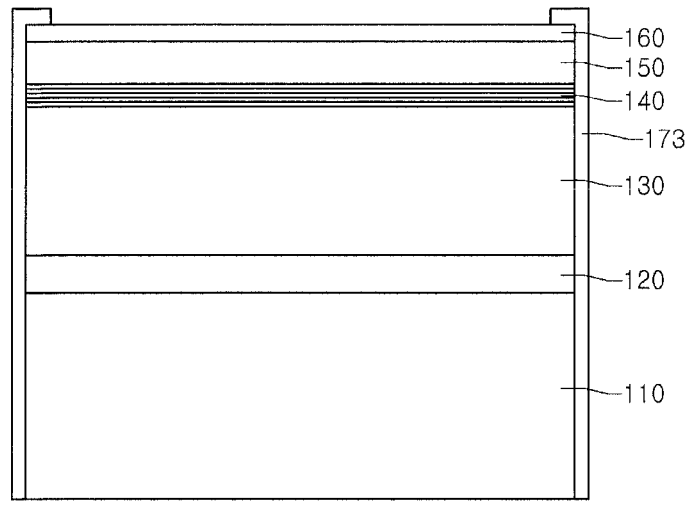
FIGS. 17 to 20 are sectional views showing a process for fabricating an LED according to an embodiment 3.

Referring to FIG. 17, a buffer layer 120, a first conductivity type semiconductor layer 130, an active layer 140, a second conductivity type semiconductor layer 150, and an ohmic contact layer 160 are formed on a substrate 110.

A third dielectric layer 173 is formed to cover the edges of the substrate 110, the buffer layer 120, the first conductivity type semiconductor layer 130, the active layer 140, the ohmic contact layer 160, and the second conductivity type semiconductor layer 150. For example, an oxide layer or a nitride layer is used to form a passivation layer (i.e., the third dielectric layer 173), thereby providing an electrical isolation from a second electrode layer 157 to be formed later.

Figure 18:
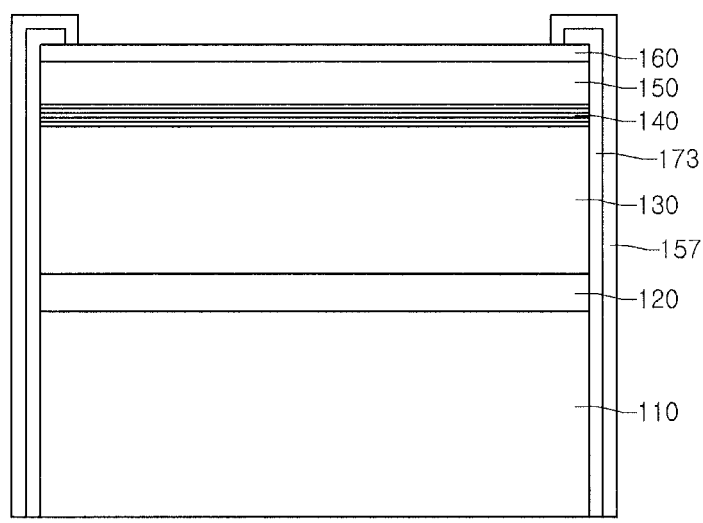

Referring to FIG. 18, a second electrode layer 157 is formed around the upper portion of the second conductivity type semiconductor layer 150. Herein, the second electrode layer 157 may be formed to cover the third dielectric layer 173. Like the first electrode layer 135, the second electrode layer 157 may be formed of a metal capable of reflecting light, to which the embodiment is not limited.

Figure 19:
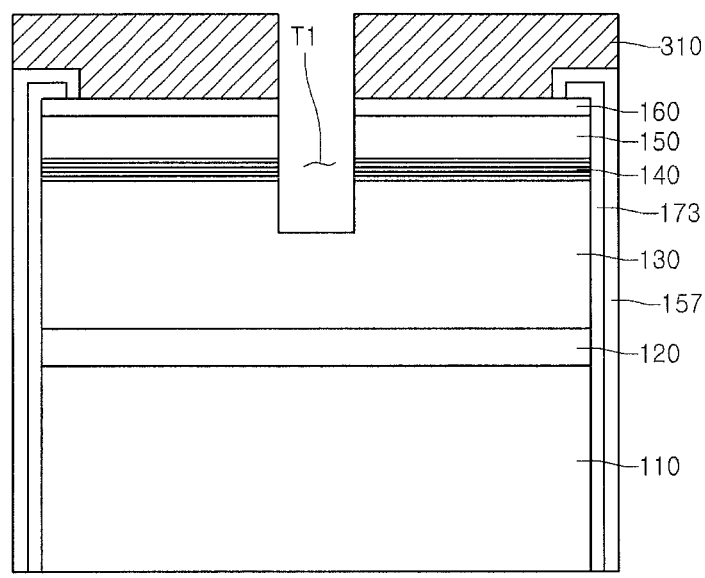

Referring to FIG. 19, using a first pattern 310 as a mask, the portions of the centers of the ohmic contact layer 160, the second conductivity type semiconductor layer 150 and the active layer 140 are removed to expose the first conductivity type semiconductor layer 130. For example, a first trench T1 may be formed to remove the portions of the centers of the ohmic contact layer 160, the second conductivity type semiconductor layer 150 and the active layer 140 are removed to expose the first conductivity type semiconductor layer 130. The first pattern 310 may be a photoresist, an oxide layer, or a nitride layer.

Figure 20:
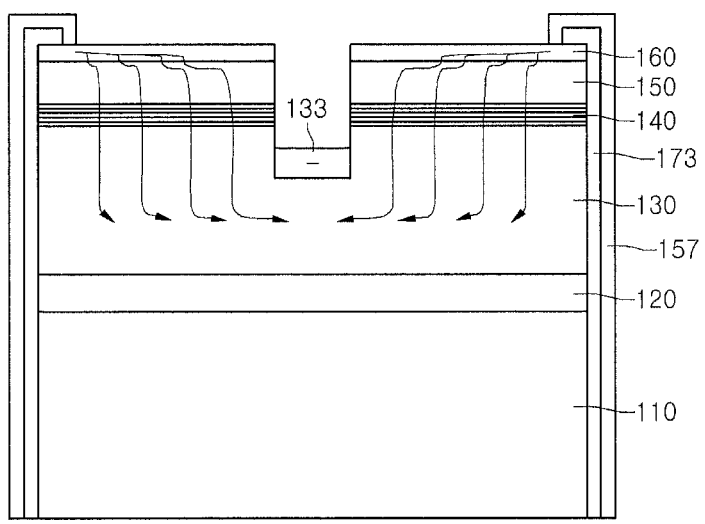

Referring to FIG. 20, a first electrode 133 may be formed on the exposed first conductivity type semiconductor layer 130. For example, the first electrode 133 may be formed on the first conductivity type semiconductor layer 130, by filling the first trench T1 with the first pattern 310 unremoved and removing the first pattern 310 through an ashing process or an etching process.

Embodiment 4

Figure 21:
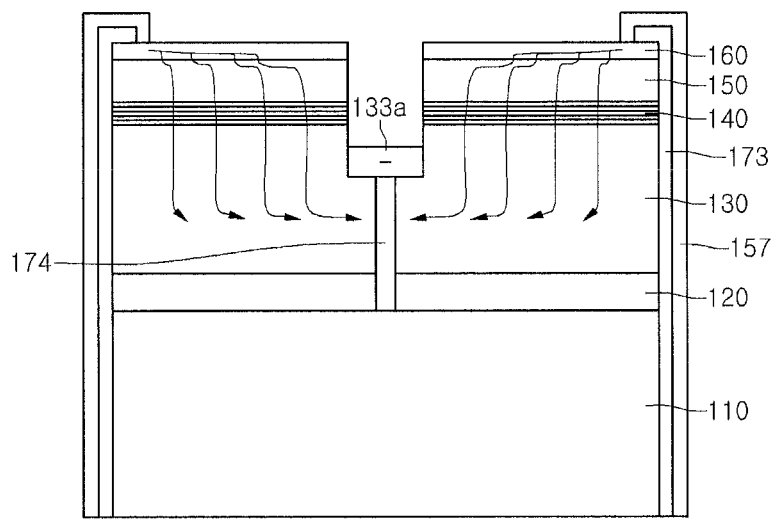
FIGS. 21 and 22 are respectively a sectional view and a plan view of an LED according to an embodiment 4.
Figure 22:
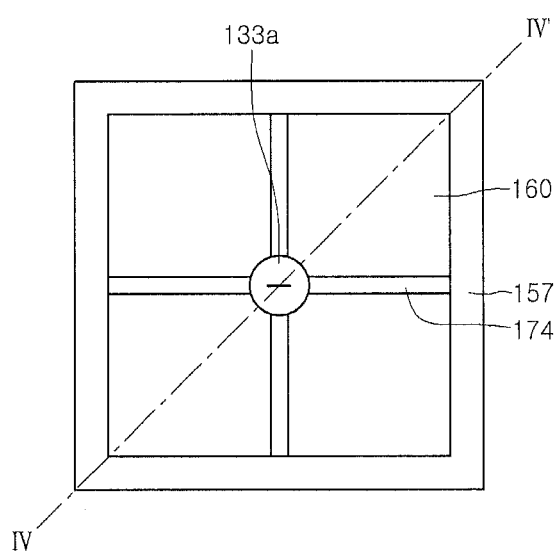
Figure 23:
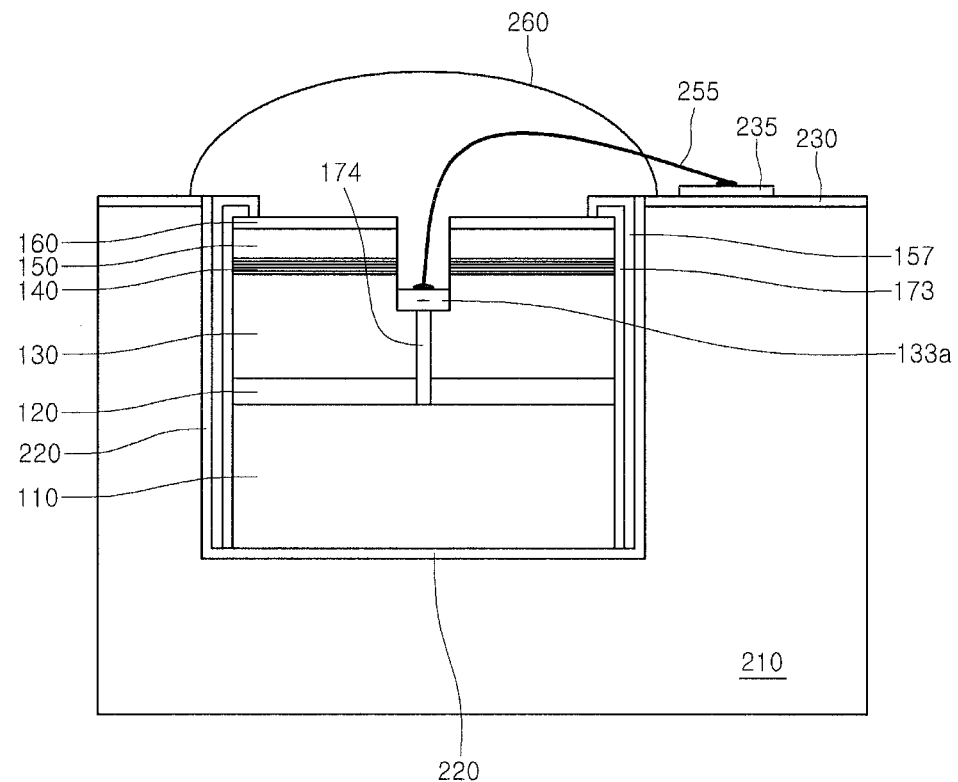
FIG. 23 is a sectional view of an LED package according to an embodiment 4.

FIGS. 21 and 22 are respectively a sectional view and a plan view of an LED according to an embodiment 4. FIG. 23 is a sectional view of an LED package according to an embodiment 4. FIG. 21 is a vertical sectional view taken along a line IV-IV' of FIG. 22.

The embodiment 4 may use the technical features of the embodiments 1 to 3. Hereinafter, a description of an overlap with the embodiments 1 to 3 will be omitted for conciseness.

Referring to FIGS. 21 and 22, the embodiment 4 includes a fourth dielectric layer 174 that divides the ohmic contact layer 160, the second conductivity type semiconductor layer 150, the active layer 140, and the first conductivity type semiconductor layer 130 into a plurality of regions.

As shown in FIGS. 21 and 22, the embodiment 4 divides the epitaxial layer into quartered squares through an etching process and distributes a current flow of a large-area chip to the quartered regions, thereby making it possible to improve the uniformity and suppress the localized heat generation. The epitaxial layer may also be divided into two or three equal parts.

FIGS. 24 to 27 are sectional views showing a process for fabricating an LED according to an embodiment 4.

Figure 24:
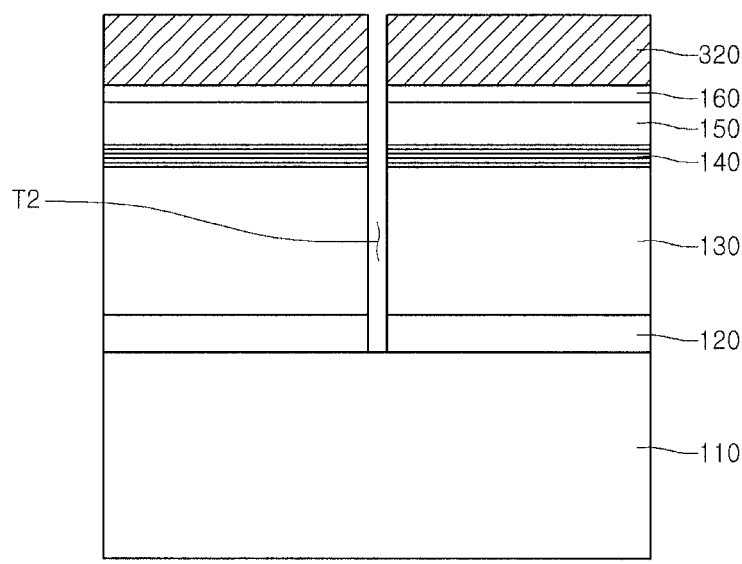
FIGS. 24 to 27 are sectional views showing a process for fabricating an LED according to an embodiment 4.

Referring to FIG. 24, a buffer layer 120, a first conductivity type semiconductor layer 130, an active layer 140, a second conductivity type semiconductor layer 150, and an ohmic contact layer 160 are sequentially formed on a substrate 110.

A second pattern 320 used as a mask to form a second trench T2 that divide the ohmic contact layer 150, the second conductivity type semiconductor layer 150, the active layer 140, the first conductivity type semiconductor layer 130 and the buffer layer 120 into a plurality of regions. The second pattern 320 may be a photoresist or a dielectric.

Figure 25:
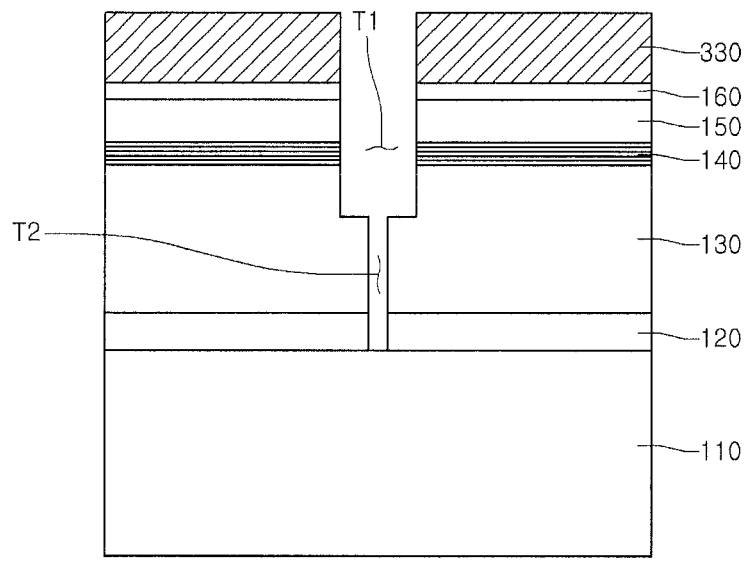

Referring to FIG. 25, the second pattern 320 is removed, and a third pattern 330 is used as a mask to remove the portions of the centers of the ohmic contact layer 160, the second conductivity type semiconductor layer 150 and the active layer 140 to expose the first conductivity type semiconductor layer 130. For example, a first trench T1 may be formed to remove the portions of the centers of the ohmic contact layer 160, the second conductivity type semiconductor layer 150 and the active layer 140.

Figure 26:
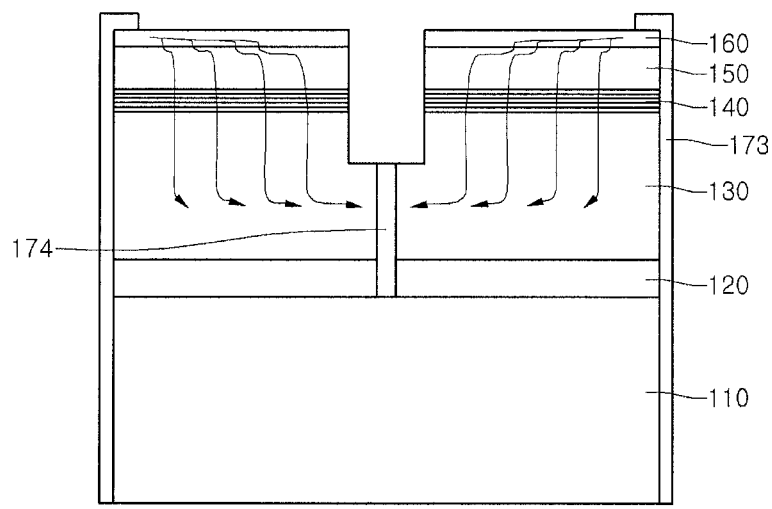

Referring to FIG. 26, the third pattern 330 may be removed through an ashing process or an etching process, a fourth dielectric layer 174 may be formed to fill the second trench T2, and a third dielectric layer 173 may be formed to cover the edges of the ohmic contact layer 160, the second conductivity type semiconductor layer 150, the active layer 140, the first conductivity type semiconductor layer 130, the buffer layer 120, and the substrate 110. For example, a dielectric layer (not shown) is formed on the chip without the third pattern 330, and the dielectric layer on the ohmic contact layer 160 and the first trench T1 is removed to simultaneously form the fourth dielectric layer 174 and the third dielectric layer 173, to which the embodiment is not limited.

Figure 27:
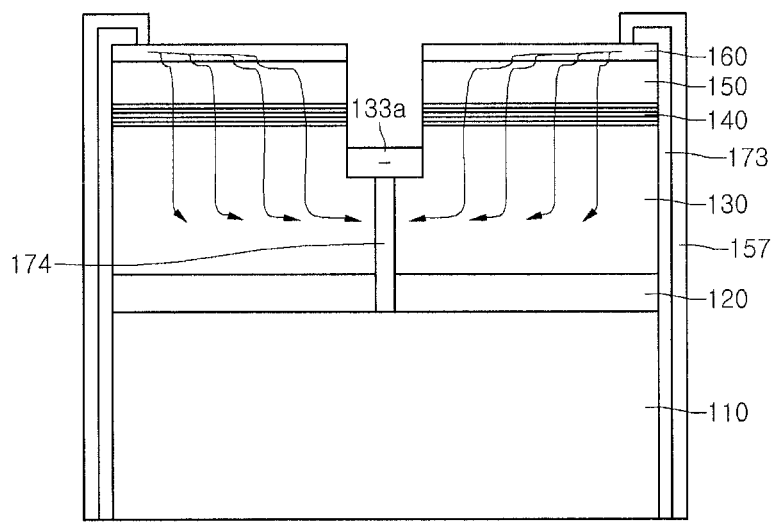

Referring to FIG. 27, a second electrode layer 157 may be formed to cover the edges of the ohmic contact layer 160 with the third dielectric layer 173, the second conductivity type semiconductor layer 150, the active layer 140, the substrate 110 and the first conductivity type semiconductor layer 130.

Also, a common first electrode 133a may be formed on the exposed first conductivity type semiconductor layer 130 and the fourth dielectric layer 174. The common first electrode 133a may be formed to contact all of the divided first conductivity type semiconductor layers 130.

The second electrode layer 157 and the common first electrode 133a may be formed simultaneously. For example, in the state of FIG. 26, a metal layer (not shown) is formed to cover the LED chip; a portion of the metal on the first trench T1 is removed to form the common first electrode 133a by leaving the metal layer to contact only the first conductivity type semiconductor layer 130; and a portion of the metal layer on the ohmic contact layer 160, thereby forming the second electrode layer 157 and the common first electrode 133a simultaneously.

The embodiment 4 divides the epitaxial layer into quartered squares through an etching process and distributes a current flow of a large-area chip to the quartered regions, thereby making it possible to improve the uniformity and suppress the localized heat generation. The epitaxial layer may also be divided into two or three equal parts.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED) comprising:
   an active layer between a first semiconductor layer of a first conductivity type and a second semiconductor layer of a second conductivity type;
   a first dielectric layer at vertically extending side edges of at least the active layer and the second semiconductor layer;
   a second dielectric layer that passes through the first and second semiconductor layers and the active layer to form a plurality of light emitting regions;
   a first electrode electrically coupled to the first semiconductor layer;
   an ohmic contact layer on the second semiconductor layer; and
   a second electrode on the ohmic contact layer;
   wherein the first electrode is electrically coupled to one or more vertically extending side edges of the first semiconductor layer,
   wherein the first dielectric layer is between the first electrode and the vertically extending side edges of the active layer and second semiconductor layer, and
   wherein the second electrode vertically overlaps with the second dielectric layer.

2. The LED of claim 1, wherein the first and second electrodes are oriented in substantially perpendicular directions.

3. The LED of claim 1, wherein the first dielectric layer:
   extends adjacent a first portion of one or more vertically extending side edges of the first semiconductor layer, and
   directs current to flow between the first and second electrodes along a path that passes through a second portion of one or more vertically extending side edges of the first semiconductor layer not adjacent to the first dielectric layer.

4. The LED of claim 1, wherein the second electrode electrically couples the second semiconductor layer in each of the plurality of light emitting regions.

5. The LED of claim 1, wherein the second dielectric layer contacts the second electrode to direct current to flow into the plurality of light emitting regions.

6. The LED of claim 1, wherein the second dielectric layer extends in a direction different from a width direction of the first and second semiconductor layers and the active layer.

7. The LED of claim 1, wherein the second dielectric layer extends in a direction substantially perpendicular to a width direction of the first and second semiconductor layers and the active layer.

8. A light emitting device (LED) package comprising:
a package body; and
a light emitting device of claim 1 coupled to the package body,
wherein the package body is conductive and coupled to the first electrode.

9. The LED of claim 1, wherein the first dielectric layer covers the vertically extending side edges of the second conductivity type semiconductor layer and the active layer.

10. The LED of claim 1, wherein the first electrode covers the edge of the first conductivity type semiconductor layer.

11. The LED of claim 1, wherein the first electrode extends to the first dielectric layer.

12. The LED of claim 1, wherein the first electrode comprises a reflective metal layer.

13. The LED of claim 1, wherein the second dielectric layer that divides the second conductivity type semiconductor layer, the active layer and the first conductivity type semiconductor layer into a plurality of regions.

14. The LED of claim 13, wherein the second electrode functions as a common electrode on the divided second conductivity type semiconductor layers.

15. The LED of claim 13, wherein the second electrode contacts all of the divided second conductivity type semiconductor layers.

16. The LED of claim 1, wherein the second electrode and the first electrode are formed of the same material.

17. The LED of claim 1, further comprising a substrate under the first semiconductor layer and wherein the second dielectric layer passes through a bottom surface of the first semiconductor layer and contacts the substrate.

18. The LED of claim 1, wherein the first electrode is disposed on a first side surface and a second side surface of the first semiconductor layer of the first conductivity type, the first and second side surfaces being opposing side surfaces.

19. The LED of claim 1, wherein the second dielectric layer, which passes through the first and second semiconductor layers and the active layer, passes through the ohmic contact layer.

20. A light emitting device (LED) comprising:
an active layer between a first semiconductor layer of a first conductivity type and a second semiconductor layer of a second conductivity type;
a first dielectric layer at vertically extending side edges of at least the active layer and the second semiconductor layer;
a second dielectric layer that passes through the first and second semiconductor layers and the active layer to form a plurality of light emitting regions;
a first electrode electrically coupled to the first semiconductor layer;
an ohmic contact layer on the second semiconductor layer; and
a second electrode on the ohmic contact layer;
wherein the first electrode is electrically coupled to one or more vertically extending side edges of the first semiconductor layer,
wherein the first dielectric layer is between the first electrode and the vertically extending side edges of the active layer and second semiconductor layer, and
wherein the second electrode directly physically contacts a top surface of the second dielectric layer.

* * * * *